United States Patent
Keck et al.

(10) Patent No.: US 11,747,396 B2
(45) Date of Patent: Sep. 5, 2023

(54) OPTICAL INTERCONNECTIONS FOR HYBRID TESTING USING AUTOMATED TESTING EQUIPMENT

(71) Applicant: OpenLight Photonics, Inc., Goleta, CA (US)

(72) Inventors: Steven William Keck, Mountain View, CA (US); Crispin Cruz Mapagay, El Dorado Hills, CA (US); Mark Stenholm, Fremont, CA (US)

(73) Assignee: OpenLight Photonics, Inc., Goleta, CA (US)

( * ) Notice: Subject to any disclaimer, the term of this patent is extended or adjusted under 35 U.S.C. 154(b) by 514 days.

(21) Appl. No.: 16/943,353

(22) Filed: Jul. 30, 2020

(65) Prior Publication Data
US 2022/0034963 A1 Feb. 3, 2022

(51) Int. Cl.
*G01R 31/317* (2006.01)
*G02B 6/42* (2006.01)
*G01N 21/31* (2006.01)

(52) U.S. Cl.
CPC ........ *G01R 31/3171* (2013.01); *G01N 21/31* (2013.01); *G02B 6/4226* (2013.01); *G01N 2201/06113* (2013.01); *G01N 2201/08* (2013.01)

(58) Field of Classification Search
None
See application file for complete search history.

(56) References Cited

U.S. PATENT DOCUMENTS

| | | | |
|---|---|---|---|
| 11,243,550 B2* | 2/2022 | Barnard | G01R 31/2862 |
| 11,411,644 B2* | 8/2022 | Keck | G01R 1/071 |
| 2006/0109015 A1 | 5/2006 | Thacker et al. | |
| 2006/0214679 A1* | 9/2006 | Henson | G01R 31/2889 324/755.05 |
| 2012/0286818 A1* | 11/2012 | Bhatt | G01R 31/2889 324/756.02 |
| 2013/0001405 A1 | 1/2013 | Walker | |
| 2020/0049737 A1 | 2/2020 | Wang et al. | |
| 2021/0033643 A1* | 2/2021 | Huebner | G02B 26/0816 |

(Continued)

FOREIGN PATENT DOCUMENTS

| | | | |
|---|---|---|---|
| CN | 114070395 A | 2/2022 | |
| EP | 3945327 A1 * | 2/2022 | G01M 11/0214 |

(Continued)

OTHER PUBLICATIONS

"European Application Serial No. 20203104.3, Extended European Search Report dated Mar. 31, 2021", 10 pgs.

*Primary Examiner* — Jermele M Hollington
(74) *Attorney, Agent, or Firm* — Schwegman Lundberg & Woessner, P.A.

(57) ABSTRACT

A hybrid optical-electrical automated testing equipment (ATE) system can implement a workpress assembly that can interface with a device under test (DUT) and a load board that holds the DUT during testing, analysis, and calibration. A test hand can actuate to position the DUT on a socket and align one or more alignment features. The workpress assembly can include two optical interfaces that are optically coupled such that light can be provided to a side of the DUT that is facing away from the load board, thereby enabling the ATE system to perform simultaneous optical and electrical testing of the DUT.

16 Claims, 7 Drawing Sheets

(56) References Cited

U.S. PATENT DOCUMENTS

2022/0034750 A1* 2/2022 Myslinski .......... G01M 11/0214
2022/0352981 A1* 11/2022 Keck .................. G01R 31/2889

FOREIGN PATENT DOCUMENTS

| EP | 3945328 A1 * | 2/2022 | ......... G01R 31/2889 |
|----|---|---|---|
| JP | 2022027371 A | 2/2022 | |
| TH | 2001006141 A | 9/2022 | |
| TW | 202204916 A1 | 2/2022 | |
| WO | 2019197320 | 10/2019 | |

* cited by examiner

US 11,747,396 B2

OPTICAL INTERCONNECTIONS FOR HYBRID TESTING USING AUTOMATED TESTING EQUIPMENT

TECHNICAL FIELD

The present disclosure generally relates to optical circuits, and more particularly to testing optical-electrical devices.

BACKGROUND

Modern high-speed integrated circuits (ICs) have complex architectures, with millions of components such as transistors that must operate in concert to transmit data at multi-gigabit data rates required by modern communication networks. One of the critical steps of manufacturing such devices is the testing and calibration of the high-speed devices to ensure the devices do not fail at a later point in time (after integration into a product). One issue with testing and calibration of such high-speed devices stems from the modern design process, in which different components of the device are designed by different companies as "off the shelf" components. To this end, automatic test equipment (ATE) can be implemented by the device engineers to efficiently test high-speed designs at the chip and wafer level. Generally, an ATE system includes one or more computer-controlled equipment or modules that interface with the device under test (DUT) to perform stress testing and analyze individual components with minimal human interaction. Current ATE systems that are configured for electronic or semiconductor devices are not configured to provide rapid testing and calibration of some modern hybrid high-speed devices, such as optical transceivers that process both electricity and light to achieve higher data rates.

BRIEF DESCRIPTION OF THE DRAWINGS

The following description includes discussion of figures having illustrations given by way of example of implementations of embodiments of the disclosure. The drawings should be understood by way of example, and not by way of limitation. As used herein, references to one or more "embodiments" are to be understood as describing a particular feature, structure, or characteristic included in at least one implementation of the inventive subject matter. Thus, phrases such as "in one embodiment" or "in an alternate embodiment" appearing herein describe various embodiments and implementations of the inventive subject matter, and do not necessarily all refer to the same embodiment. However, they are also not necessarily mutually exclusive. To easily identify the discussion of any particular element or act, the most significant digit or digits in a reference number refer to the figure ("FIG.") number in which that element or act is first introduced.

Descriptions of certain details and implementations follow, including a description of the figures, which may depict some or all of the embodiments described below, as well as discussing other potential embodiments or implementations of the inventive concepts presented herein. An overview of embodiments of the disclosure is provided below, followed by a more detailed description with reference to the drawings.

DETAILED DESCRIPTION

In the following description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, structures, and techniques are not necessarily shown in detail.

Modern ATE systems are not configured to rapidly test, validate, and calibrate modern hybrid high-speed devices, such as optical transceivers, which include both complex electrical and optical modules. To this end, a hybrid optical-electrical ATE system can be implemented that uses one or more electrical interfaces to interface with electrical apparatuses of the ATE system and one or more optical interfaces (e.g., fibers, lens, gratings) to interface with optical components of the ATE system. In some example embodiments, the hybrid optical-electrical ATE system is implemented by augmenting an electrical ATE system (e.g., an available off-the-shelf electrical ATE system) with dual interface optical assembly that couples light from optical testing devices (e.g., light sources, optical analysis devices) to the device under test via a handler assembly that actuates the optical interfaces into position via a passive alignment process. In some example embodiments, the dual interfaces include a load board optical interface that couples light to the handler assembly and an optical device interface that couples light from the handler assembly to the optical-electrical device under test. In some example embodiments, the handler assembly includes an optical connector (e.g., fiber) to couple to the two interfaces such that when aligned light can be provided to and received from the device under test. In some example embodiments, the device under test is placed in a socket within a load board mount or docking plate having alignment features that interlock with corresponding alignment features on the mount assembly. To passively align the optical interfaces (e.g., without active actuators or electrical/optical feedback based alignment), the handler assembly can move the mount assembly to interlock the alignment features thereby aligning the two optical interfaces for simultaneous electrical and optical ATE testing.

Figure 1:
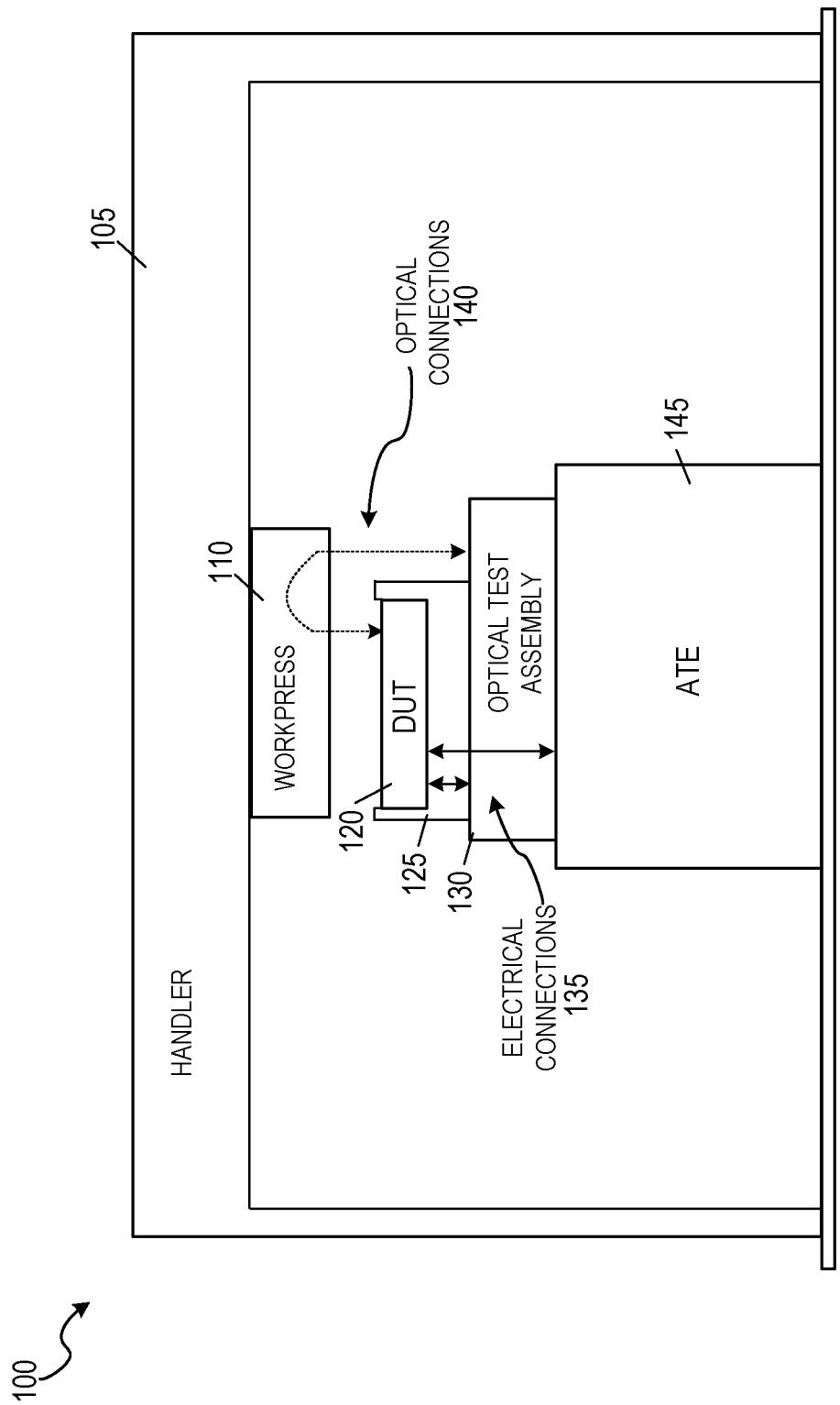
FIG. 1 shows an optical and electrical testing system for implementing simultaneous optical and electrical testing of photonic devices, according to some example embodiments.

FIG. 1 shows an optical and electrical testing system 100 for implementing simultaneous optical and electrical testing of photonic devices, according to some example embodiments. As illustrated, a handler 105 (e.g., IC handler, chip hander) is a robotic system that can precisely move a DUT 120 into position for testing and calibration. A workpress assembly 110 is attached to the handler 105 to move the DUT 120 to the test socket 123. The test socket 123 is further positioned on an optical test assembly 130, which provides optical testing of the DUT 120 using one or more optical devices modules (e.g., an optical spectrum analyzer) and an electrical ATE 145, which provides electrical automated testing using one or more electrical analyzer modules. The DUT 120 is electrically connected via electrical connections 135 (e.g., high-speed test socket 123) to the optical test assembly and the ATE 145. Furthermore, the DUT 120 can interface optically with the optical test assembly using one or more optical connections 140, including the two interfaces, according to some example embodiments. For example, the optical connections 140 can be implemented as optical paths that extend from the optical test assembly 130 into the workpress assembly 110, and are turned back towards the topside of the DUT 120 (e.g., which can be a top side, or "bottom side" in a flip chip configuration where the "top side" faces towards an interposer or host board). Further functional components and details of the optical test assembly are discussed in further detail below, with reference to FIGS. 3A and 3B. Once aligned with the optical and electrical contacts of the optical and electrical testing system 100, the DUT 120 can undergo simultaneous electrical and optical testing and calibration.

Figure 2:
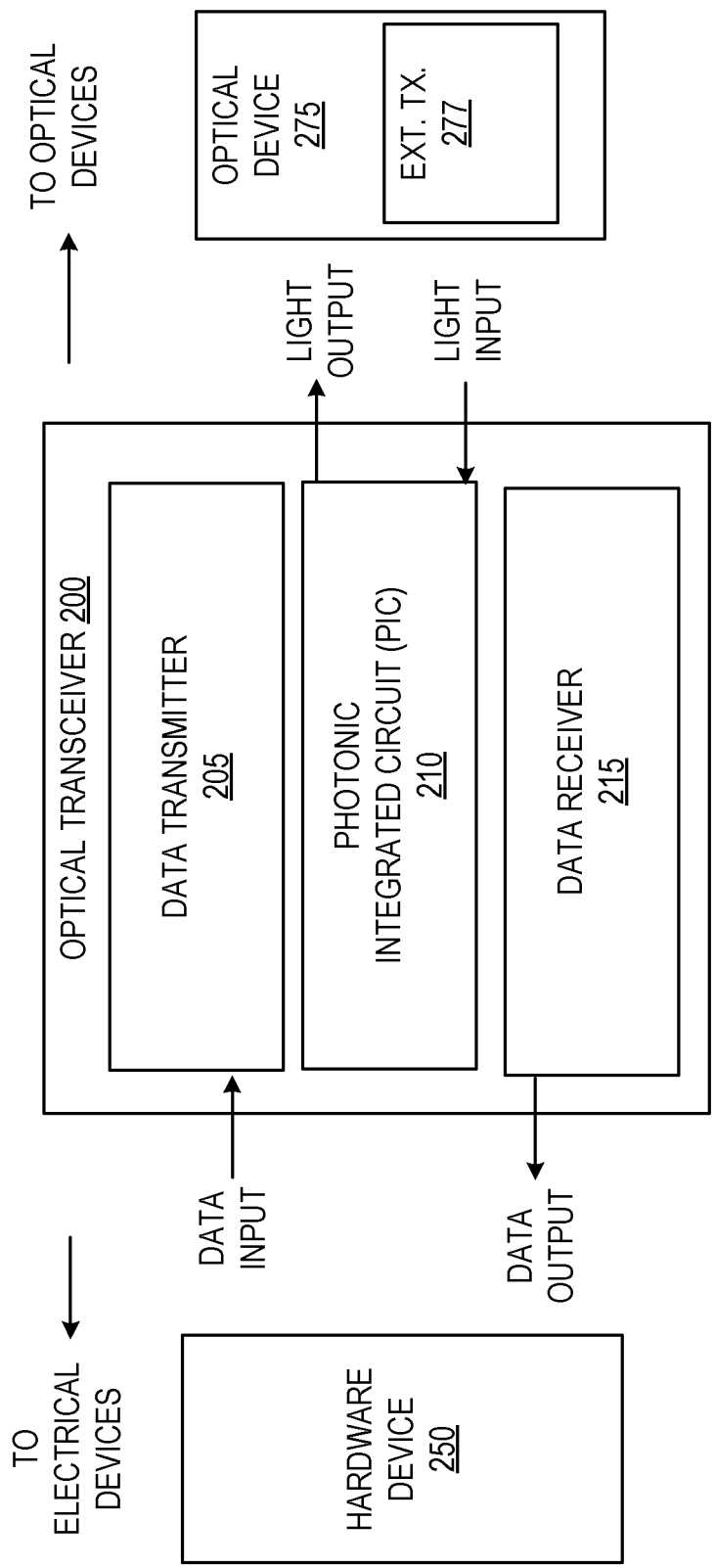
FIG. 2 is a block diagram illustrating an optical transceiver for transmitting and receiving optical signals, according to some example embodiments.

FIG. 2 is a block diagram illustrating an optical transceiver 200 for transmitting and receiving optical signals, according to some example embodiments. The optical transceiver 200 is an example optical-electrical device under test that can be tested using the optical and electrical testing system 100 of FIG. 1. In the example illustrated in FIG. 2, the optical transceiver 200 processes data from electrical devices, such as electrical hardware device 250, converts the electrical data into optical data, and sends and receives the optical data with one or more optical devices, such as optical device 275. For example, the electrical hardware device 250 can be a host board that "hosts" the optical transceiver 200 as a pluggable device that sends and receives data to an optical switch network; where, for example, optical device 275 can be other components of an optical switch network (e.g., external transmitter 277). However, it is appreciated that the optical transceiver 200 can be implemented to interface with other types of electrical devices and optical devices. For instance, the optical transceiver 200 can be implemented as a single chip on a hybrid "motherboard" that uses an optical network (e.g., waveguides, fibers) as an optical bus to interconnect on-board electrical chips that process the data after it is converted from light into binary electrical data, according to some example embodiments.

In some example embodiments, the hardware device 250 includes an electrical interface for receiving and mating with an electrical interface of the optical transceiver 200. The optical transceiver 200 may be a removable front-end module that may be physically received by and removed from hardware device 250 operating as a backend module within a communication system or device. The optical transceiver 200 and the hardware device 250, for example, can be components of an optical communication device or system (e.g., a network device) such as a wavelength-division multiplexing (WDM) system or a parallel fiber system (e.g., parallel-single fiber (PSM)), according to some example embodiments.

The data transmitter 205 of the optical transceiver 200 can receive the electrical signals, which are then converted into optical signals via photonic integrated circuit 210 (PIC). The PIC 210 can then output the optical signals via optical links, such as fiber or waveguides that interface with the PIC 210. The output light data can then be processed by other components (e.g., switches, endpoint servers, other embedded chips of on a single embedded system), via a network such as a wide area network (WAN), optical switch network, optical waveguide network in an embedded system, and others.

In receiver mode, the optical transceiver 200 can receive high data rate optical signals via one or more optical links to optical device 275. The optical signals are converted by the PIC 210 from light into electrical signals for further processing by data receiver 215, such as demodulating the data into a lower data rate for output to other devices, such as the electrical hardware device 250. The modulation used by the optical transceiver 200 can include pulse amplitude modulation (e.g., 4-level PAM, such as "PAM4"), quadrature phase-shift keying (QPSK), binary phase-shift keying (BPSK), polarization-multiplexed BPSK, M-ary quadrature amplitude modulation (M-QAM), and others.

Figure 3A:
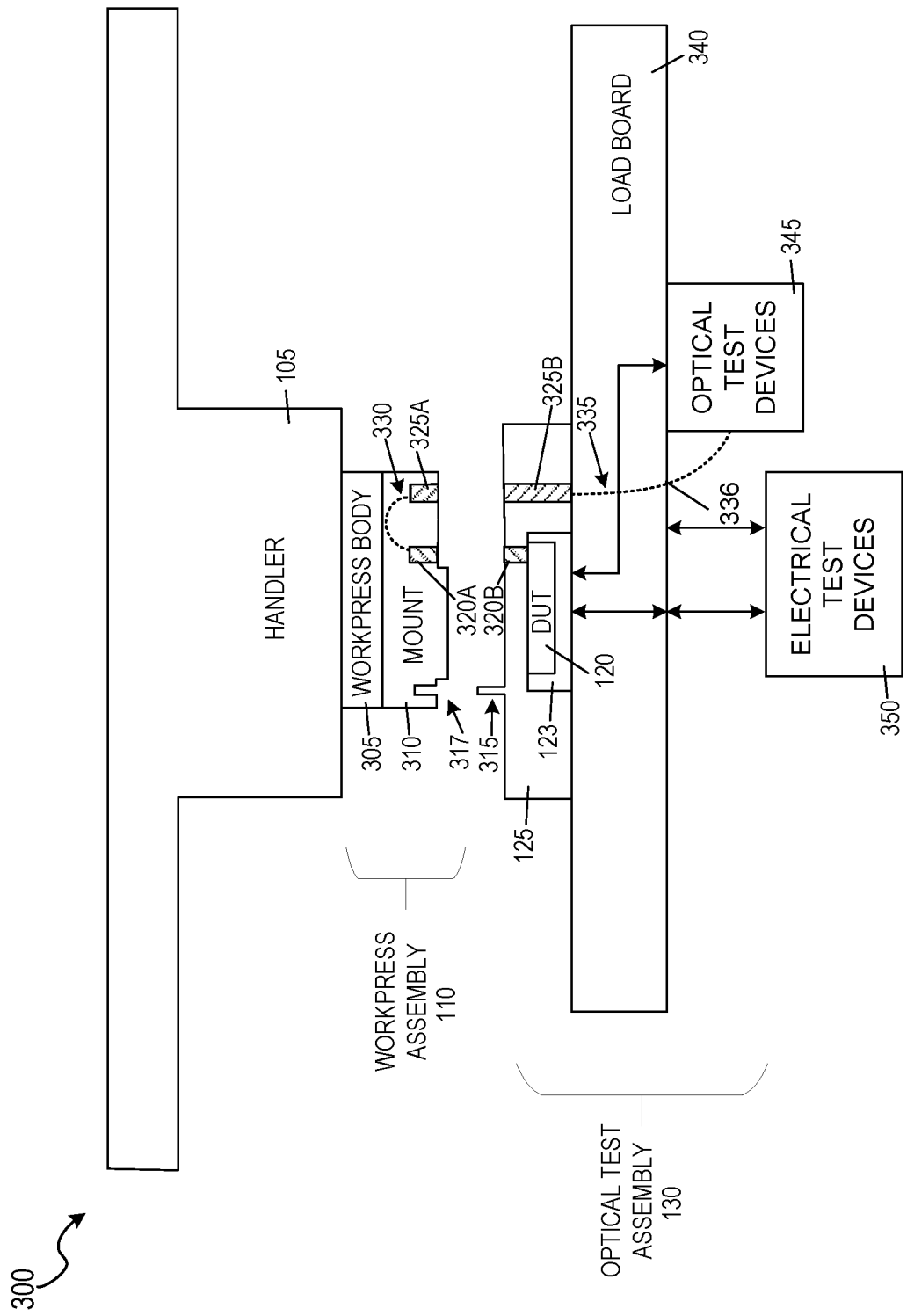
FIG. 3A shows an example dual optical interface architecture for hybrid optical-electrical ATE testing, according to some example embodiments.

FIG. 3A shows an example dual optical interface architecture 300 for hybrid optical-electrical ATE testing, according to some example embodiments. In the illustrated example, the handler 105 is an ATE device or chip handler that uses the workpress assembly 110 to align the optical interfaces for testing. The workpress assembly 110 includes a workpress body 305 (e.g., metal assembly), and a mount 310 that can be customized for different sorts of DUTs (e.g., Blade-Pak™, plastic mount that is customizable for different DUTs).

The DUT 120 is positioned on the load board 340 by the handler 105. In some example embodiments, the DUT 120 can be placed in a socket 123 on a docking plate 125. The docking plate 125 can include mounting features for handler-based device alignment, such as feature 315 which is congruent with feature 317 of the mount 310. The features 315 and 317 are used for approximate or "coarse" alignment to place the dual interface ports near one another for further alignment, according to some example embodiments. In particular, for example, after aligning features 315 and 317 to place the DUT 120 near the mount 310, the dual interfaces are optically aligned using optical alignment features with have integrated fine adjustment features, as discussed in further detail with reference to FIG. 3B below.

In the example of FIG. 3A, the optical connector interface comprises port 320A, which is optically coupled to port 320B (e.g., an optical port integrated in DUT 120, a grating of DUT 120); and the load board optical interface includes port 325A which is optically coupled to port 325B. Further, the port 320A and port 325A are optically coupled via a coupling, e.g., fiber 330, to transmit and receive light to the optical receiving side of the DUT 120 (e.g., the top-side of DUT 120, though it is appreciated that the DUT 120 can be implemented as a "flip-chip" configuration, where the side facing away from the load board 340 is referred to the back or bottom side, as is known in the art).

Light can be coupled to the mount 310 via fibers 335 connected to the port 325B that is fixed in position by the docking plate 125. In some example embodiments, the load board 340 is an off-the-shelf load board for a given ATE system (e.g., ATE system of handler 105), and a hole 336 is created in the load board 340 through which the fibers 335 can pass through to connect to the port 325B.

The top-side of the load board 340 functions as a DUT test bench that supports the DUT 120 during testing. The top-side of the load board 340 can include electrical pathways to electrically connect the electrical circuits of the DUT 120 to one or more electrical test devices (e.g., test modules or line cards of the ATE 145, FIG. 1).

To physically align the optical device interface and the load board interface, the workpress assembly 110 positions the mount 310 on the docking plate 125 such that device mounting features (e.g., feature 317, a hole) of the mount 310 align and interlock with the mounting features of the docking plate 125 (e.g., feature 315, a post or extruded feature). To optically align the optical interfaces, optical alignment features which are physically smaller and more precise (higher tolerance) are used for passive optical alignment. Once the coarse alignment features and more precise optical features are aligned, the optical device interface and the load board optical interface are both passively optically aligned (e.g., the port 320A is passively aligned with port 320B and further the port 325A is passively aligned with 325B).

In some example embodiments, the optical device interface (e.g., comprising port 320A and port 320B) is implemented using one or more optical components (e.g., lens, grating, prism) to propagate light over the interface. For example, the port 320 can include a micro-lens array or grating that receives light from the fiber 330 and directs the light towards port 320B. Further, port 320B can include a grating that receives the light from the port 320 and couples the light into an optical port of the DUT 120 (e.g., couples light into a grating of the DUT 120 for modulation and receives modulated light from the grating of the DUT 120 for analysis).

Further, in some example embodiments, the load board interface (e.g., comprising port 325A and port 325B) is implemented using one or more optical components to propagate light over the interface. For example, the port 325 can include an optical connector lens that couples light from the fiber 335 and directs the light towards the port 325A, which can be implemented as a lens or grating to receive the light and couple it into the fiber 330. In some example embodiments, the ports 320A, 320B, 325A, and 325B can be implemented using different optical devices, such as gratings, lenses, free space optics, butt-coupling optics to one another (e.g., placing terminating ends of fibers side-by-side to optically couple), as so forth.

In some example embodiments, the optical-electrical DUT 120 is a multi-channel device, comprising four different optical lanes for four different channels. For example, the optical-electrical DUT 120 can be a 400 GBASE optical transceiver comprising four channels, where each of the channels manages 100 G of optical data. In those example embodiments, the optical interconnects from optical test devices 345 to the DUT 120 are increased for each of the channels. For example, fiber 335 can include eight fibers, where four of the fibers transmit light generated by the light sources in the optical test devices 345 to the DUT for processing (e.g., modulation) and another four of the fibers are receive fibers for receiving light for each of the channels from DUT (e.g., receiving light modulated by optical modulators on the DUT 120). Likewise, the fiber 330 and the ports 320A, 320B, 325A, and 325B each handle four channels (e.g., by having eight gratings, lens, or fibers; four for transmitting to the DUT and four for receiving light from the DUT).

After the optical interfaces of the DUT 120 are passively aligned (e.g., by aligning ports 325A (first mount assembly optical port) with port 325B (optical port of device), and 320A (second mount assembly optical port) with port 320B (load board optical port)), the DUT 120 can undergo simultaneous electrical and optical testing of DUT 120 to more accurately simulate the performance of the DUT 120 at operation time (e.g., in the field, after integration in a network device or product). For example, optical transceiver components of the DUT 120 can be tested via optical test devices 345 while electrical components used to control the optical components are tested and analyzed by electrical test devices 350 (e.g., a bit error rate tester, a parametric measurement unit, device power supply). In some example embodiments in which the DUT 120 is a multi-channel network device, each of the channels is tested separately, one at a time, where selection is performed via an optical switch. Further details of the switch and physical interconnection structures for the mount 310 and the docking plate 125 are discussed in "Multi-Lane Optical-Electrical Device Testing Using Automated Testing Equipment," filed on even date herewith, which is incorporated by reference in its entirety.

Figure 3B:
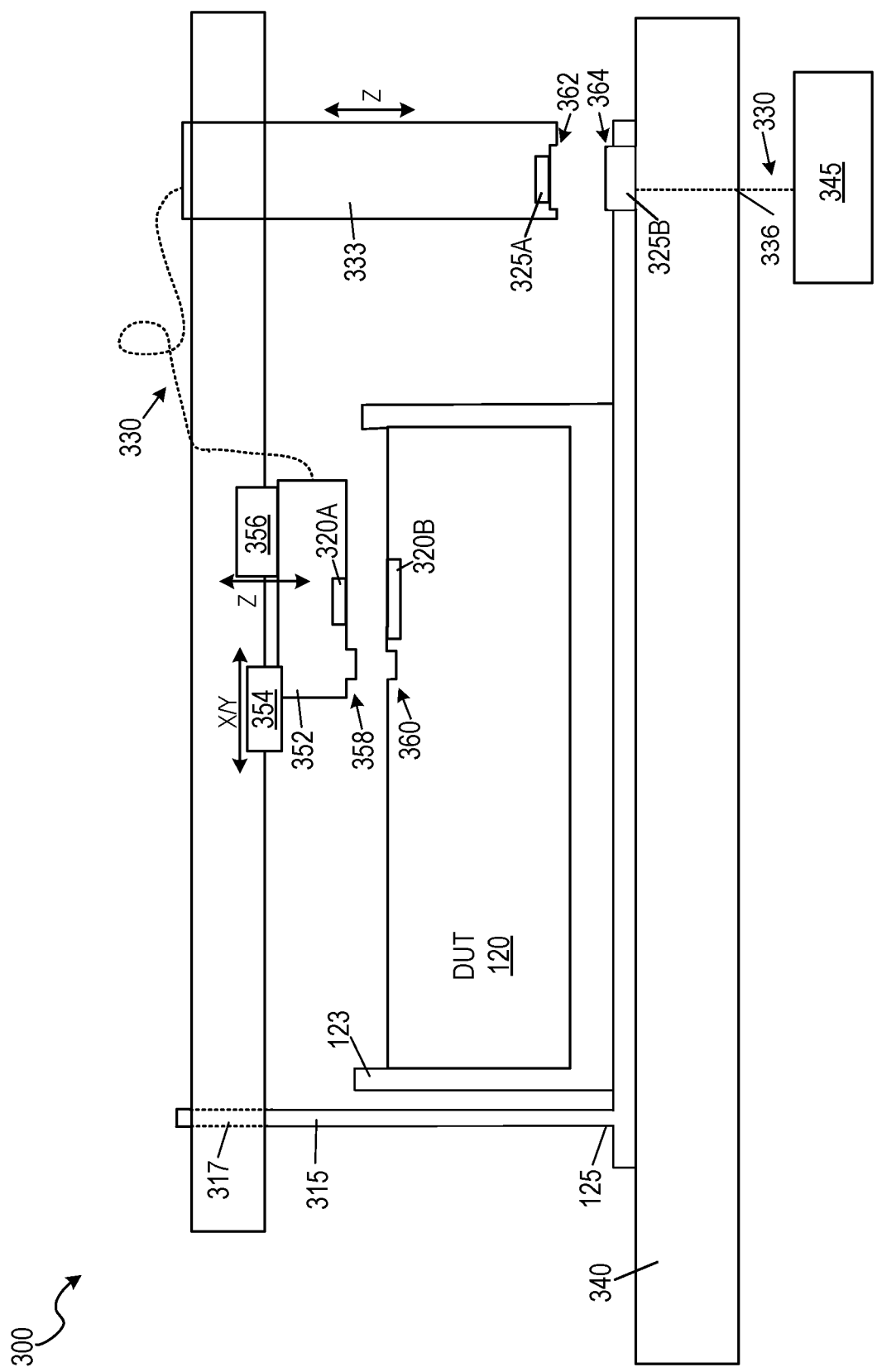
FIG. 3B shows a detailed view of the dual interface architecture, according to some example embodiments.

FIG. 3B shows a detailed view 370 of the optical interface architecture, according to some example embodiments. In FIG. 3B, the device alignment features includes feature 315 of the docking plate 125 which is interlocked with feature 317, which can be a hole in the mount 310. For further optical alignment, an optical interconnect head 352 is attached to the mount 310 using one or more mechanical adjusters (e.g., screws) and a spring adjuster 356. The optical interconnect head can receive the fiber 330 which is further connected to beam 333 (e.g., a plastic beam that is slide-able in the vertical, "Z" direction). In the example of FIG. 3B, the handler 105 (not depicted) moves the mount 310 until the feature 315 is inserted into feature 317 to complete approximate alignment. Next, further optical alignment is performed by guiding the mount 310 (e.g., via the handler 105, or by hand) until the port 325A on the beam 333 couples to port 325B of the docking plate 125. In some example embodiments, the beam 333 has receiver feature 362 that interlocks with the extruded feature 364 to optically couple the ports 325A and 325B (e.g., free space coupler, butt-couple, grating to lens coupling, etc.).

Further, the optical interconnect head 352 is actuated by the handler 105 (e.g., by an actuator, robotic arm) until a fine optical alignment feature 358 (e.g., grooved/interlocking alignment feature) snaps into a corresponding feature 360 on the DUT 120. In some example embodiments, the DUT 120 does not include alignment features and instead a receptacle is placed on the DUT and the receptable includes the feature 360 into which the feature 358 interlocks. The features 358, 360, 362, 364 are physically smaller to ensure precise passive optical coupling between the ports 320A, 320B, 325A, and 325B without performing active alignment (e.g., using a light source to optically align the ports). For instance, the features 358 and 360 can be fabricated to be on the same scale as the ports 320A and 320B (e.g., 5 mm wide) to ensure that once the features 358 and 360 interlocked, the ports 320A and 320B are precisely optically coupled. Further, the features 362 and 364 are fabricated on a same or similar scale as the ports 325A and 325B (e.g., 5-10 mm scale) to ensure that once the beam 333 interlocks with the docking plate 125 (via interconnection of features 362 and 364), the ports 325A and 325B are also optically aligned and coupled without using active alignment.

In some example embodiments, the optical interconnect head 352 is configured as an optical blind mate-able connector that precisely snaps into place using the spring adjuster 356 providing tension in the vertical "Z" direction and X/Y positioning using the mechanical adjusters 354, which can be screws to move the head 352 for X/Y alignment. For example, the head 352 floats in three dimensions (X, Y, and Z), and the adjusters 354 can be adjusted first to adjust the X and Y alignment, followed by lowering the mount 310 and the optical interconnected head 352 until tension provided by the spring adjuster 356 snaps the fine optical alignment features 358 and 360 into aligned and locking position. In some example embodiments, the head 352 floats in three dimensions on springs without the mechanical adjusters. For example, the adjusters 354 can be implemented as springs to provide tension in the X axis, Y axis or both. In these example embodiments, the head 352 snaps into passive alignment via the tension such that the fine alignment features interlock thereby passively aligning the optical device interface.

Figure 4:
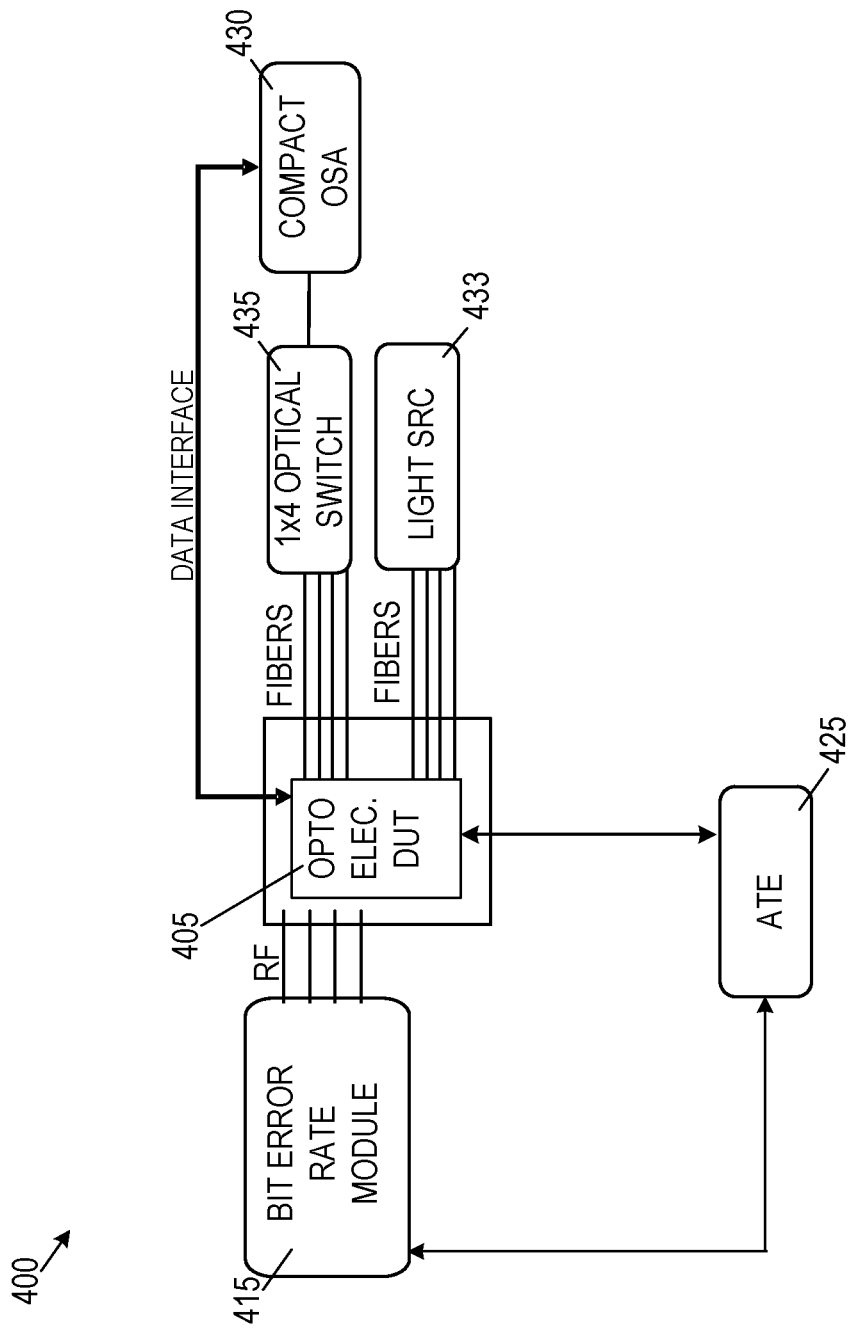
FIG. 4 displays an optical-electrical ATE architecture, according to some example embodiments.

FIG. 4 displays an optical-electrical ATE interconnection architecture 400, according to some example embodiments. The optical-electrical ATE interconnection architecture 400 is an example implementation of the optical test assembly 130 for optical testing and calibration of optical devices. At a high level, the ATE 425 interfaces with the optical-electrical DUT 405 and a bit error rate module 415 (e.g., an embedded BER tester), according to some example embodiments. Further, and in accordance with some example embodiments, the ATE 425 can interface and display data from a compact optical spectrum analyzer 430 (OSA) that interfaces electrically with the DUT 405 using a data interface (e.g., RS-232), and optically via one or more fibers and an optical switch 435. In some example embodiments, the DUT 405 receives light one or more fibers coupled to a light source 433 which couples light into the receive port of the DUT 405. The DUT 405 receives the light and generates modulated light using one or more modulators. The fibers extending from the light source 433 to the DUT 405 and the fibers extending from the DUT 405 to the optical switch 435 can be implemented as the optical connections 140 coupled using the interfaces as discussed in FIG. 3, according to some example embodiments. In some example embodiments, the optical switch 435 is operable to select one of the available plurality of fibers for output to the compact OSA 430.

Figure 5:
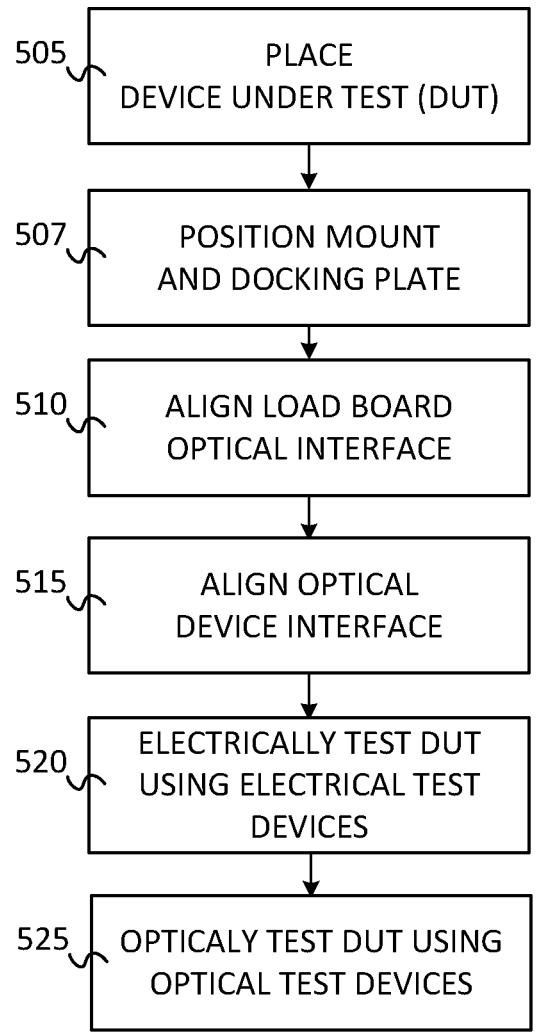
FIG. 5 shows a flow diagram of a method for hybrid testing of an optical-electrical DUT, according to some example embodiments.

FIG. 5 shows a flow diagram of a method 500 for hybrid testing of an optical-electrical DUT, according to some example embodiments. At operation 505, a device handler (e.g., handler 105, chip handler) places the optical-electrical DUT on the hybrid testing platform, such the load board 340. In some example embodiments, the optical-electrical DUT is placed directly on the load board and a socket comprising optical connectors is connected with the DUT to provide optical connectivity. In some example embodiments, the socket having the load board connector is pre-attached to the load board and the optical-electrical DUT is placed on the socket, as in FIG. 1. In some example embodiments, the optical-electrical DUT is placed on the load board, and a socket is attached (e.g., epoxied) to the optical-electrical DUT to interlock the mount assembly onto the docking plate via interlocking physical features (e.g., features 358, 360, 362, and 364).

At operation 507, the mount and docking plate are approximately aligned using one or more coarse alignment features. For example, a feature 315 is interlocked with a feature 317 or hole in the mount 310. At operation 510, the load board optical interface is aligned to couple light from the load board (e.g., from docking plate 125, port 325B, fiber 335) to the handler assembly (e.g., couple with port 325A of the mount 310 via interlocking feature 362 of beam 333 with feature 364 of the docking plate 125).

At operation 515, the optical device interface is aligned to couple light to the optical-electrical DUT. For example, the optical device interface is aligned to couple light from the port 320A (e.g., lens array) to port 320B (e.g., grating) which is coupled to an input/output port of the optical-electrical DUT.

In some example embodiments, operations 510 and 515 are performed simultaneously by moving the mount 310 (e.g., via the handler 105 or by hand) until both interfaces snap or interlock passively. For example, in order to align the interfaces of the ATE system for hybrid test, the ATE handler can implement a mount assembly having physical features (e.g., posts, grooves) that interlock with congruent interlocking features on the docking plate. In those example embodiments, by aligning the mount to the docking plate using the interlocking physical features, both the load board optical interface and the optical device interface are passively aligned, thereby completing an optical path from optical components of the ATE system (e.g., optical test devices 345) and the optical-electrical DUT without requiring active light based alignment.

At operation 520, the optical-electrical DUT undergoes electrical testing to test and calibrate components of the optical-electrical DUT (e.g., using electrical test device 350, one or more line-cards of an electrical ATE system). At operation 530, the optical-electrical DUT undergoes optical testing to test and calibrate optical components of the optical-electrical DUT (e.g., using optical test devices 345, an OSA). In some example embodiments, the optical-electrical DUT undergoes optical testing using light internally generated by the DUT. For example, the DUT can include one or more integrated light sources (e.g., lasers) that generate light that is modulated and output to the testing device via the optical connections. In some example embodiments, the optical-electrical DUT undergoes testing using one or more external light sources (e.g., light from light source 433, FIG. 4), which can be input, modulated and output via the optical connections 140, as discussed above.

In some example embodiments, operations 525 and 530 are performed simultaneously to better simulate the optical-electrical DUT operating environment. For example, with reference to FIG. 3, after the optical-electrical DUT 120 is electrically connected to the electrical test device 350 via load board 340 and optically connected to optical test device 345 (e.g., via the optical interfaces), each lane of the optical-electrical DUT 120 can be tested to calibrate electrical components (e.g., transmitter circuit, receiver circuit), and optical components (e.g., optical modulator, heaters) at the same time.

Figure 6:
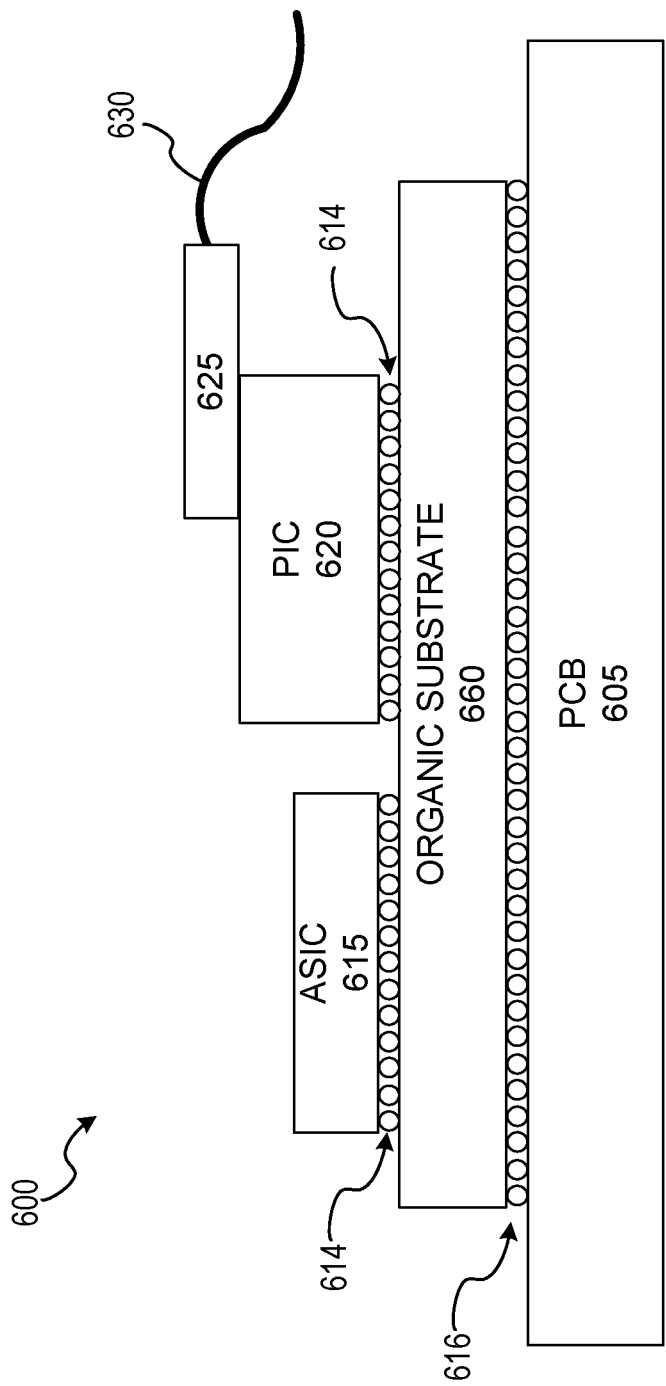
FIG. 6 shows an optical-electrical device including one or more optical devices, according to some example embodiments.

FIG. 6 is an illustration of an optical-electrical device 600 (e.g., optical-electrical DUT 120, optical transceiver 200) including one or more optical devices, according to an embodiment of the disclosure. In this embodiment, the optical-electrical device 600 is a multi-structure chip package that includes a printed circuit board (PCB) substrate 605, organic substrate 660, application specific integrated circuit 615 (ASIC), and photonic integrated circuit 620 (PIC). In this embodiment, the PIC 620 may include one or more optical structures described above (e.g., PIC 210).

In some example embodiments, the PIC 620 includes silicon on insulator (SOI) or silicon-based (e.g., silicon nitride (SiN)) devices, or may comprise devices formed from both silicon and a non-silicon material. Said non-silicon material (alternatively referred to as "heterogeneous material") may comprise one of III-V material, magneto-optic material, or crystal substrate material. III-V semiconductors have elements that are found in group III and group V of the periodic table (e.g., Indium Gallium Arsenide Phosphide (InGaAsP), Gallium Indium Arsenide Nitride (GaInAsN)). The carrier dispersion effects of III-V-based materials may be significantly higher than in silicon-based materials, as electron speed in III-V semiconductors is much faster than that in silicon. In addition, III-V materials have a direct bandgap which enables efficient creation of light from electrical pumping. Thus, III-V semiconductor materials enable photonic operations with an increased efficiency over silicon for both generating light and modulating the refractive index of light. Thus, III-V semiconductor materials enable photonic operation with an increased efficiency at generating light from electricity and converting light back into electricity.

The low optical loss and high quality oxides of silicon are thus combined with the electro-optic efficiency of III-V semiconductors in the heterogeneous optical devices described below; in embodiments of the disclosure, said heterogeneous devices utilize low loss heterogeneous optical waveguide transitions between the devices' heterogeneous and silicon-only waveguides.

Magneto-optic materials allow heterogeneous PICs to operate based on the magneto-optic (MO) effect. Such devices may utilize the Faraday Effect, in which the magnetic field associated with an electrical signal modulates an optical beam, offering high bandwidth modulation, and rotates the electric field of the optical mode enabling optical isolators. Said magneto-optic materials may comprise, for example, materials such as iron, cobalt, or yttrium iron garnet (YIG). Further, in some example embodiments, crystal substrate materials provide heterogeneous PICs with a high electro-mechanical coupling, linear electro optic coefficient, low transmission loss, and stable physical and chemical properties. Said crystal substrate materials may comprise, for example, lithium niobate (LiNbO3) or lithium tantalate (LiTaO3). In the example illustrated, the PIC 620 exchanges light with fiber 630 via prism 625; said prism 625 is a misalignment-tolerant device used to couple an optical mode to one or more single-mode optical fibers (e.g., to transmit light to and from an optical network), according to some example embodiments.

In some example embodiments, the optical devices of PIC 620 are controlled, at least in part, by control circuitry included in ASIC 615. Both ASIC 615 and PIC 620 are shown to be disposed on copper pillars 614, which are used for communicatively coupling the ICs via organic substrate 660. PCB 605 is coupled to organic substrate 660 via ball grid array (BGA) interconnect 616, and may be used to interconnect the organic substrate 660 (and thus, ASIC 615 and PIC 620) to other components of optical-electrical device 600 not shown, such as interconnection modules, power supplies, and so forth.

The following are example embodiments:

Example 1

A method for testing an optical-electrical device under test (DUT) using an automated testing equipment (ATE) system, the method comprising: aligning a load board optical interface between a load board of the ATE system and a mount assembly of the ATE system, a top-side of the load board supporting the optical-electrical DUT such that an electrical interface side of the optical-electrical DUT interfaces with electrical paths on the top-side of the load board to communicate one or more electrical signals from the optical-electrical DUT, the load board optical interface aligned by aligning a load board optical port of the load board with a first mount assembly optical port of the mount assembly; aligning an optical device interface between the mount assembly and the optical-electrical DUT to communicate one or more optical signals generated by the optical-electrical DUT, the optical device interface aligned by aligning a second mount assembly optical port of the mount assembly with an optical port of the optical-electrical DUT that is on an optical interface side of the optical-electrical DUT that is opposite of the electrical interface side that faces the load board; and analyzing the one or more electrical signals while analyzing the one or more optical signals from the optical-electrical DUT using the ATE system, the one or more electrical signals analyzed by an electrical test device of the ATE system that receives the one or more electrical signals from the electrical paths of the load board, the one or more optical signals analyzed by an optical testing device of the ATE system that receives the one or more optical signals via propagation through the optical device interface and the load board optical interface.

Example 2

The method of example 1, wherein the first mount assembly optical port is optically coupled to the second mount assembly optical port by an optical coupling such that light from the optical-electrical DUT propagates from the optical device interface through the optical coupling to the load board optical interface.

Example 3

The method of any of examples 1 or 2, wherein the coupling comprises one or more fiber optic cables.

Example 4

The method of any of examples 1-3, wherein one or more additional fiber optic cables optically couple the load board optical interface to the optical testing device of the ATE system.

Example 5

The method of any of examples 1-14, wherein the load board comprises an opening through which the one or more additional fiber optical cables pass to connect to the load board optical interface.

Example 6

The method of any of examples 1-15, wherein the optical-electrical DUT is a multi-channel device for transmitting light beams on different channels; and wherein the one or more additional fiber optic cables comprises a plurality of transmit fiber cables for providing light to the optical-electrical DUT for each of the different channels.

Example 7

The method of any of examples 1-6, wherein the one or more additional fiber optical cables comprises a plurality of receive fiber cables for receiving light from the optical-electrical DUT for each of the different channels.

Example 8

The method of any of examples 1-7, wherein the mount assembly is a handler assembly that is connected to a self-aligning mount of the ATE system that positions the ATE system to align the load board optical interface and the optical device interface.

Example 9

The method of any of examples 1-8, wherein the load board comprises a docking plate having physical mounting features that align corresponding physical mounting features on the mount assembly.

Example 10

The method of any of examples 1-9, wherein initial aligning is performed by aligning the physical mounting features of the docking plate with corresponding physical mounting features of the mount assembly.

Example 11

The method of any of examples 1-10, wherein the optical testing device is an optical spectrum analyzer.

Example 12

The method of any of examples 1-11, wherein the optical testing device is an optical power meter.

Example 13

The method of any of examples 1-12, wherein the electrical testing device is a bit error rate module.

Example 14

The method of any of examples 1-13, wherein the electrical testing device comprises a device power supply and a parametric measurement unit.

Example 15

An automated testing equipment (ATE) system for testing of an optical-electrical device under test (DUT), the ATE system comprising: a load board having a top-side to support the optical-electrical DUT such that an electrical interface side of the optical-electrical DUT interfaces with electrical paths of the top-side of the load board; a mount assembly to position the optical-electrical DUT on the load board, the mount assembly optically interfaced with the load board by a load board optical interface and optically interfaced with the optical-electrical DUT by an optical device interface, the load board optically coupled by passively aligning a first mount assembly optical port of the mount assembly with a load board optical port of the load board, the optical device interface optically coupled by passively aligning a second mount assembly optical port of the mount assembly with an optical port of the optical-electrical DUT, the optical port of the optical-electrical DUT being on an opposite side of the electrical interface side that faces the load board; and an electrical test device to analyze one or more electrical signals from the optical-electrical DUT, the one or more electrical signals received from the electrical paths of the load board; and an optical test device to analyze one or more optical signals from the optical-electrical DUT, the one or more optical signals received by the optical test device from the optical-electrical DUT via propagation through the optical device interface and the load board interface, the one or more optical signals being analyzed by the optical test device of the ATE system while the one or more electrical signals are analyzed by the electrical test device of the ATE system.

Example 16

The ATE system of example 15, wherein the first mount assembly optical port is optically coupled to the second mount assembly optical port by an optical coupling such that light from the optical-electrical DUT propagates from the optical device interface through the optical coupling to the load board optical interface.

Example 17

The ATE system of any of examples 15-16, wherein the optical coupling comprises one or more fiber optic cables

Example 18

The ATE system of any of examples 15-17, wherein the mount assembly is a handler assembly that is connected to a self-aligning mount of the ATE system that positions the ATE system to align the load board optical interface and the optical device interface.

Example 19

The ATE system of any of examples 15-18, wherein the self-aligning mount is adjustable in three dimensions.

Example 20

The ATE system of any of examples 15-19, wherein the self-aligning mount comprises one or more spring adjusters that provides tension to at least one of the three dimensions.

In the foregoing detailed description, the method and apparatus of the present inventive subject matter have been described with reference to specific exemplary embodiments thereof. It will, however, be evident that various modifications and changes may be made thereto without departing from the broader spirit and scope of the present inventive subject matter. The present specification and figures are accordingly to be regarded as illustrative rather than restrictive.

What is claimed is:

1. A method for testing an optical-electrical device under test (DUT) using an automated testing equipment (ATE) system, the method comprising:
   aligning a load board optical interface between a load board of the ATE system and a mount assembly of the ATE system, a top-side of the load board supporting the optical-electrical DUT such that an electrical interface side of the optical-electrical DUT interfaces with electrical paths on the top-side of the load board to communicate one or more electrical signals from the optical-electrical DUT, the load board optical interface aligned by aligning a load board optical port of the load board with a first mount assembly optical port of the mount assembly;
   aligning an optical device interface between the mount assembly and the optical-electrical DUT to communicate one or more optical signals generated by the optical-electrical DUT, the optical device interface aligned by aligning a second mount assembly optical port of the mount assembly with an optical port of the optical-electrical DUT that is on an optical interface side of the optical-electrical DUT that is opposite of the electrical interface side that faces the load board, wherein:

the first mount assembly optical port is optically coupled to the second mount assembly optical port by an optical coupling comprising one or more fiber optic cables such that light from the optical-electrical DUT propagates from the optical device interface through the optical coupling to the load board optical interface; and analyzing the one or more electrical signals while analyzing the one or more optical signals from the optical-electrical DUT using the ATE system, the one or more electrical signals analyzed by an electrical test device of the ATE system that receives the one or more electrical signals from the electrical paths of the load board, the one or more optical signals analyzed by an optical testing device of the ATE system that receives the one or more optical signals via propagation through the optical device interface and the load board optical interface.

2. The method of claim 1, wherein one or more additional fiber optic cables optically couple the load board optical interface to the optical testing device of the ATE system.

3. The method of claim 2, wherein the load board comprises an opening through which the one or more additional fiber optical cables pass to connect to the load board optical interface.

4. The method of claim 3, wherein the optical-electrical DUT is a multi-channel device for transmitting light beams on different channels; and wherein the one or more additional fiber optic cables comprises a plurality of transmit fiber cables for providing light to the optical-electrical DUT for each of the different channels.

5. The method of claim 4, wherein the one or more additional fiber optical cables comprises a plurality of receive fiber cables for receiving light from the optical-electrical DUT for each of the different channels.

6. The method of claim 1, wherein the mount assembly is a handler assembly that is connected to a self-aligning mount of the ATE system that positions the ATE system to align the load board optical interface and the optical device interface.

7. The method of claim 1, wherein the load board comprises a docking plate having physical mounting features that align corresponding physical mounting features on the mount assembly.

8. The method of claim 7, wherein initial aligning is performed by aligning the physical mounting features of the docking plate with corresponding physical mounting features of the mount assembly.

9. The method of claim 1, wherein the optical testing device is an optical spectrum analyzer.

10. The method of claim 1, wherein the optical testing device is an optical power meter.

11. The method of claim 1, wherein the electrical testing device is a bit error rate module.

12. The method of claim 1, wherein the electrical testing device comprises a device power supply and a parametric measurement unit.

13. An automated testing equipment (ATE) system for testing of an optical-electrical device under test (DUT), the ATE system comprising:
    a load board having a top-side to support the optical-electrical DUT such that an electrical interface side of the optical-electrical DUT interfaces with electrical paths of the top-side of the load board;
    a mount assembly to position the optical-electrical DUT on the load board, the mount assembly optically interfaced with the load board by a load board optical interface and optically interfaced with the optical-electrical DUT by an optical device interface, the load board optically coupled by passively aligning a first mount assembly optical port of the mount assembly with a load board optical port of the load board, the optical device interface optically coupled by passively aligning a second mount assembly optical port of the mount assembly with an optical port of the optical-electrical DUT, the optical port of the optical-electrical DUT being on an opposite side of the electrical interface side that faces the load board, wherein:
        the first mount assembly optical port is optically coupled to the second mount assembly optical port by an optical coupling comprising one or more fiber optic cables such that light from the optical-electrical DUT propagates from the optical device interface through the optical coupling to the load board optical interface;
    an electrical test device to analyze one or more electrical signals from the optical-electrical DUT, the one or more electrical signals received from the electrical paths of the load board; and
    an optical test device to analyze one or more optical signals from the optical-electrical DUT, the one or more optical signals received by the optical test device from the optical-electrical DUT via propagation through the optical device interface and the load board interface, the one or more optical signals being analyzed by the optical test device of the ATE system while the one or more electrical signals are analyzed by the electrical test device of the ATE system.

14. The ATE system of claim 13, wherein the mount assembly is a handler assembly that is connected to a self-aligning mount of the ATE system that positions the ATE system to align the load board optical interface and the optical device interface.

15. The ATE system of claim 14, wherein the self-aligning mount is adjustable in three dimensions.

16. The ATE system of claim 15, wherein the self-aligning mount comprises one or more spring adjusters that provides tension to at least one of the three dimensions.

* * * * *